US006225198B1

(12) United States Patent
Alivisatos et al.

(10) Patent No.: US 6,225,198 B1
(45) Date of Patent: May 1, 2001

(54) PROCESS FOR FORMING SHAPED GROUP II-VI SEMICONDUCTOR NANOCRYSTALS, AND PRODUCT FORMED USING PROCESS

(75) Inventors: A. Paul Alivisatos, Oakland, CA (US); Xiaogang Peng, Fayetteville, AR (US); Liberato Manna, Palo del Colle (IT)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/499,095

(22) Filed: Feb. 4, 2000

(51) Int. Cl.[7] .............................. H01L 21/20; H01L 21/36
(52) U.S. Cl. ........................ 438/497; 438/46; 438/102; 438/497; 257/64; 420/513; 420/525; 420/526; 423/289; 423/299
(58) Field of Search .................................... 438/102, 497, 438/962; 423/289, 299; 420/513, 525, 526

(56) References Cited

U.S. PATENT DOCUMENTS

| 5,262,357 | 11/1993 | Alivisatos et al. | 437/233 |
|---|---|---|---|
| 5,505,928 | 4/1996 | Alivisatos et al. | 423/299 |
| 5,537,000 | 7/1996 | Alivisatos et al. | 313/506 |
| 5,751,018 | 5/1998 | Alivisatos et al. | 257/64 |

OTHER PUBLICATIONS

Dabbousi, B.O., et al., "(CdSe) ZnS Core–Shell Quantum Dots: Synthesis and Characterization of a Size Series of Highly Luminescent Nanocrystal –lites", *Journal of Physical Chemistry B*, vol. 101, 1997, pp. 9463–9475.

Peng, Xiaogang, et al., "Epitaxial Growth of Highly Luminescent CdSe/CdS Core/Shell Nanocrystals with Photostability and Electronic Accessibility", *Journal of the American Chemical Society*, vol. 119, No. 30, pp. 7019–7029.

Bruchez, M., Jr., et al., "Semiconductor Nanocrystals as Fluorescent Biological Labels", *Science*, 281, Sep. 25, 1998, pp. 2013–2016.

Han, W., et al., "Synthesis of Gallium Nitride Nanorods Through a Carbon Nanotube–Confined Reaction", *Science*, 277, Aug. 29, 1997, pp. 1287–1289.

Huynh, W.U., et al., "CdSe Nanocrystal Rods/Poly (3–hexylthiophene) Composite Photovoltaic Devices", *Advanced Materials*, 11, 1999, pp. 923–927.

Kabay, N., et al., "Removal of Metal Pollutants (Cd(II) and Cr (III)) from Phosphoric Acid Solutions by Chelating Resins Containing Phosphonic or Diphosphonic Groups", *Industrial & Engineering Chemistry Research*, 37, 1998, pp. 2541–2547.

Kolosky, M., et al., "Determination of Trioctylphosphine Oxide and Its Impurities by Reversed–Phase High–Performance Liquid Chromatography", *Journal of Chromatography*, 299, 1984, pp. 436–444.

Lieber, C.M., "One–Dimensional Nanostructures: Chemistry, Physics & Applications", *Solid State Communications*, 107, (11) , 1998, pp. 607–616.

(List continued on next page.)

*Primary Examiner*—Charles Bowers
*Assistant Examiner*—Asok Unmar Sarkar
(74) *Attorney, Agent, or Firm*—John P. Taylor

(57) ABSTRACT

A process for the formation of shaped Group II-VI semiconductor nanocrystals comprises contacting the semiconductor nanocrystal precursors with a liquid media comprising a binary mixture of phosphorus-containing organic surfactants capable of promoting the growth of either spherical semiconductor nanocrystals or rod-like semiconductor nanocrystals, whereby the shape of the semiconductor nanocrystals formed in said binary mixture of surfactants is controlled by adjusting the ratio of the surfactants in the binary mixture.

36 Claims, 2 Drawing Sheets

OTHER PUBLICATIONS

Murray, C.B., et al., "Synthesis and Characterization of Nearly Monodisperse CdE (E=S, Se, Te) Semiconductor Nanocrystallites", *Journal of the American Chemical Society,* 115, 1993, pp. 8706–8715.

Peng, X., et al., "Kinetics of II–VI and III–V Colloidal Semiconductor Nanocrystal Growth: 'Focusing' of Size Distributions", *Journal of the American Chemical Society,* 120, 1998, pp. 5343–5344.

Routkevitch, D., et al., "Electrochemical Fabrication of CdS Nanowire Arrays in Porous Anodic Aluminum Oxide Templates", *Journal of Physical Chemistry,* 100, 1996, pp. 14037–14047.

Schlamp, M.C., et al., "Improved Efficiencies in Light Emitting Diodes Made with CdSe (CdS) Core/Shell Type Nanocrystals and a Semiconducting Polymer", *Journal of Applied Physics,* 82, (11), Dec. 1, 1997, pp. 5837–5842.

Wang, W., et al., "Synthesis and Characterization of MSe (M=Zn, Cd) Nanorods by a New Solvothermal Method", *Inorganic Chemistry Communications,* 2, 1999, pp. 83–85.

PROCESS FOR FORMING SHAPED GROUP II-VI SEMICONDUCTOR NANOCRYSTALS, AND PRODUCT FORMED USING PROCESS

CROSS-REFERENCE TO RELATED APPLICATION

This application is related to U.S. patent application Ser. No. 09/499,096, entitled PROCESS FOR FORMING SHAPED GROUP III-V SEMICONDUCTOR NANOCRYSTALS, AND PRODUCT FORMED USING PROCESS, which was filed on Feb. 4, 2000, and is assigned to the assignee of this invention.

The invention described herein arose in the course of, or under, Contract No. DE-AC03-SF00098 between the United States Department of Energy and the University of California for the operation of the Ernest Orlando Lawrence Berkeley National Laboratory. The Government may have rights to the invention.

BACKGROUND OF THE INVENTION

1. Field of the Invention

This invention relates to a process for making shaped semiconductor nanocrystals and a resulting product therefrom. More particularly, this invention relates to a process for controlling the shape of Group II-VI semiconductor nanocrystals during the formation of same.

2. Description of the Related Art

Semiconductor nanocrystals, such as Group II-VI nanocrystals are formed by dissolving a Group II precursor and a Group VI precursor in a solvent and then applying heat to the solvent and the precursors therein. For example, Group II-VI semiconductor nanocrystals may be formed by dissolving a dialkyl of the Group II metal and a Group VI powder in a trialkyl phosphine solvent at ambient temperature, and then injecting the mixture into a heated (340° C.–360° C.) bath of tri-octyl phosphine oxide (TOPO).

While the just described process is capable of producing Group II-VI semiconductor nanocrystals, the results can be somewhat erratic in terms of average particle size and size distribution. While it is not certain why the process is not always reproducible, it is believed that impurities in the technical grade (90% pure) TOPO may be adversely influencing the reaction. However, substitution of pure TOPO for the technical grade TOPO has also been unsatisfactory, particularly when control of the shape of the particle growth is also desired, apparently because the pure TOPO binds too weakly to the growing crystallites and only weakly associates with the Group II metal to act as a growth retardant, resulting in the growth of spheres rather than any other desired shapes. Apparently, the presence of impurities in the technical grade TOPO result in the erratic success of Group II-VI semiconductor nanocrystal growth in technical grade TOPO.

The growth of rod-like semiconductor crystals has been reported by W. Z. Wang et al. in "Synthesis and Characterization of MSe (M=Zn, Cd) nanorods by a New Solvothermal Method", Inorganic Chemistry Communications 1999 Mar, Vol. 2, N3:83–85. However, the rod-shaped crystals are out of the confinement region, i.e., are not of nanocrystal dimensions.

Alivisatos et al. U.S. Pat. No. 5,505,928, by one of us with another, and assigned to the assignee of this invention, and the subject matter of which is hereby incorporated by reference, describes a process for forming Group Ill-V semiconductor nanocrystals wherein size control is achieved through use of a crystallite growth terminator which controls the size of the growing crystals. Crystallite growth terminators are said to include a nitrogen-containing or a phosphorus-containing polar organic solvent having an unshared pair of electrons. The patent states that this growth terminator can complex with the metal and bind to it, thereby presenting a surface which will prevent further crystal growth.

Since Group II-VI semiconductor nanocrystals are of interest for use in optical displays, as well as in biological applications, it would be desirable to provide a process for control of shape as well as size growth of such Group II-VI semiconductor nanocrystals wherein the shape (aspect ratio), as well as the particle size, growth rate, and particle size distribution, can be reproducibly controlled, whereby, for example, spheres or rods of semiconductor nanocrystals of controlled dimensions could be formed in a controllable and repeatable manner.

SUMMARY OF THE INVENTION

In accordance with the invention, a process for the formation of shaped Group II-VI semiconductor nanocrystals comprises contacting a solution of the semiconductor nanocrystal precursors with a liquid media comprising a binary surfactant mixture capable of promoting the growth of either spherical semiconductor nanocrystals or rod-like semiconductor nanocrystals, whereby the shape of the semiconductor nanocrystals formed in the binary mixture of surfactants is controlled by adjusting the ratio of the surfactants in the binary mixture.

Figure 1:
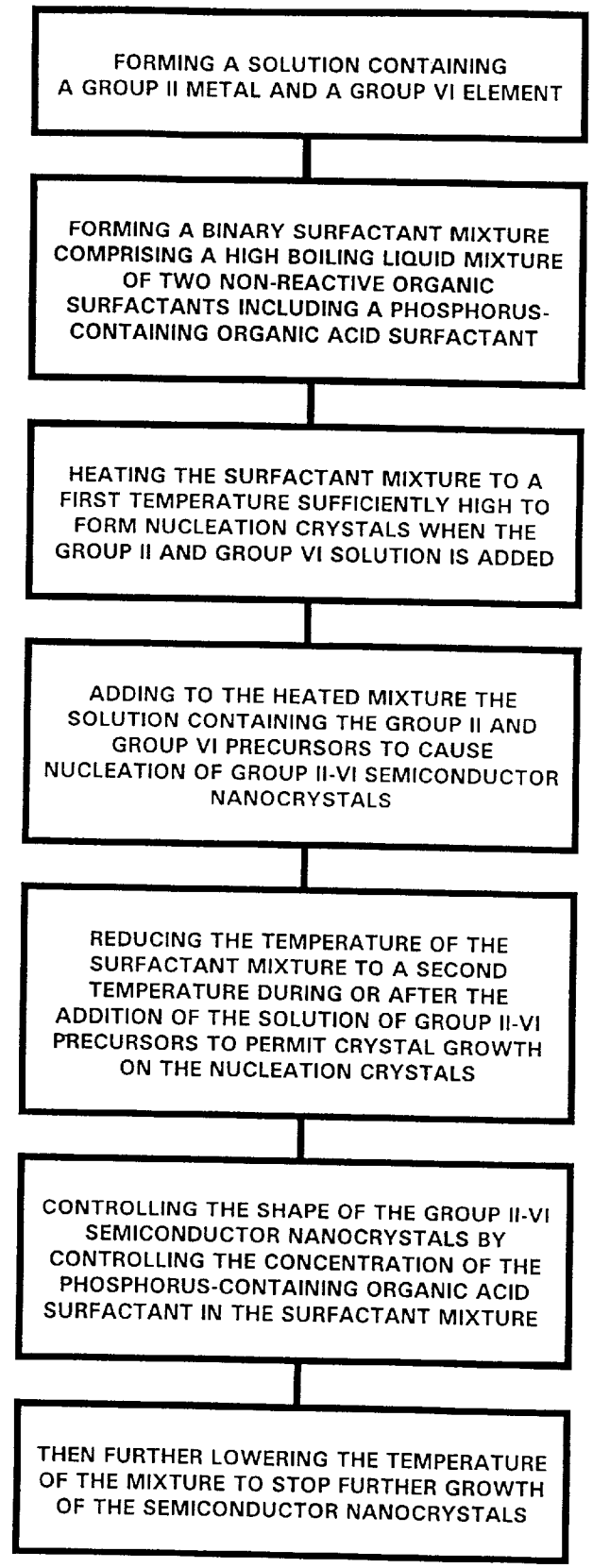
FIG. 1 is a flow sheet describing the process of the invention.
Figure 2:
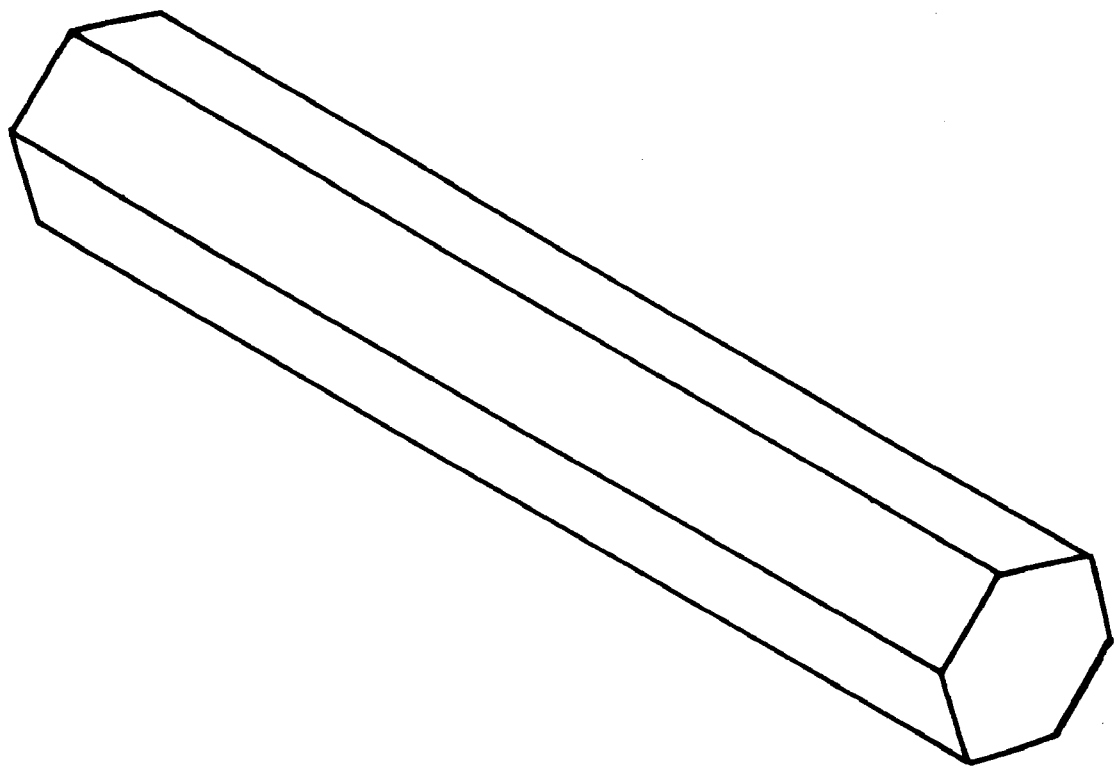
FIG. 2 depicts a rod-shaped semiconductor nanocrystal formed using the process of the invention.

DETAILED DESCRIPTION OF THE INVENTION a. Introduction

The invention comprises a process for the formation of shaped Group II-VI semiconductor nanocrystals comprises contacting a solution of the semiconductor nanocrystal precursors with a liquid media comprising a binary surfactant mixture capable of promoting the growth of either spherical nanocrystals or rod-like nanocrystals, whereby the shape of the semiconductor nanocrystals formed in said binary mixture of surfactants is controlled by adjusting the ratio of the surfactants in the binary mixture.

b. Semiconductor Nanocrystal Constituents

The precursors used to form the shaped Group II-VI semiconductor nanocrystals are particular Group II and Group VI precursors used to form Group II-VI semiconductor nanocrystals. Thus, by use of the term "semiconductor nanocrystal" is meant a nanocrystal comprising the reaction of at least one particular Group II metal with at least one particular Group VI element. It should be noted here that the expression "at least one" is used in recognition of the fact that, for example, a particular Group II metal precursor may be reacted with more than one particular Group VI precursor, and vice versa. The purity of the particular Group II and Group VI precursors should be at least about 99.9 wt. % to avoid introduction of impurities into the reaction which could have an effect on control of the growth of the semiconductor nanocrystals.

By use of the term "particular Group II metal" is meant zinc, cadmium, or mercury (Zn, Cd, or Hg). By use of the term "particular Group VI element" is meant sulfur, selenium, or tellurium (S, Se, or Te).

c. Semiconductor Nanocrystal Sizes

By use of the term "nanocrystal" is meant a small crystal having dimensions not exceeding about 20 nm, and preferably not exceeding about 10 nm, along at least 2 axes of the crystal. It should be noted that the above definition of the term "nanocrystal" is somewhat different than previous definitions of the term in that this definition takes into account the possibility of some extended growth of the nanocrystal along the third axis of the crystal while maintaining the very small dimensions of the other two axes, resulting in the possibility of growth of a rod-like shaped semiconductor nanocrystal or quantum rod of very small cross-section (diameter).

d. Binary Surfactant Mixture

By use herein of the term "binary surfactant mixture" is meant a high boiling liquid mixture of two non-reactive organic surfactants in which the reaction to form the Group II-VI semiconductor nanocrystals takes place. The binary mixture of non-reactive organic surfactants is capable of promoting the growth of either spherical semiconductor nanocrystals or rod-like shaped semiconductor nanocrystals, depending on the ratio of the surfactants.

The binary surfactant mixture referred to above as a high boiling liquid mixture should have a boiling point sufficient to permit it (the binary surfactant mixture) to be maintained at a temperature high enough to permit reaction between the Group II and Group VI precursors to form the desired semiconductor nanocrystals. Typically, the binary surfactant mixture has a boiling point sufficiently high to permit the binary surfactant mixture to be maintained at a temperature of from at least about 200° C., but not exceeding about 400° C.

The first organic surfactant in the binary mixture may be defined as any liquid surfactant capable of being heated to such crystal-growing temperatures and which further promotes growth of spherically shaped semiconductor nanocrystals with increased percentage of the first surfactant in the ratio of the surfactants in the binary mixture, i.e., when a sufficient amount of the first surfactant is present in the binary mixture of surfactants.

Preferably the first liquid surfactant in the binary mixture will comprise a phosphorus-containing surfactant capable of withstanding such crystal-growing temperatures. Examples of such first phosphorus-containing liquid surfactants include liquid surfactants such as 3–18 carbon trialkyl phosphines (e.g., tributyl phosphine), or 3–18 carbon trialkyl phosphine oxides (e.g., trioctyl phosphine oxide—TOPO). To avoid the introduction of impurities which may have an unpredictable effect on the reaction, the organic surfactant capable of promoting the formation of spherical semiconductor nanocrystals should preferably have a purity of at least 99 wt. %.

The second organic surfactant in the binary mixture may defined as any liquid surfactant capable of being heated to such crystal-growing temperatures and which further promotes growth of rod-like shaped semiconductor nanocrystals with increased percentage of the second surfactant in the ratio of the surfactants in the binary mixture, i.e., when a sufficient amount of the second surfactant is present in the binary mixture of surfactants.

Preferably the second liquid surfactant capable of promoting the growth of rod-like shaped semiconductor nanocrystals will also comprise a phosphorus-containing surfactant capable of withstanding such crystal-growing temperatures.

Preferably, the second organic surfactant comprises an organic-substituted acid, or acid salt surfactant containing phosphorus such as, for example, phosphonic and phosphinic acids. Such phosphonic acids useful in the practice of the invention have the general formula $ROP(OH)_2$, where R is a 3–18 carbon (but preferably a 6–10 carbon) organic group such as an alkyl or aryl group, and can be shown by the two resonance forms:

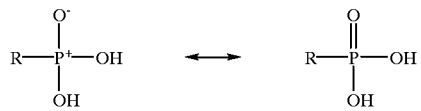

Phosphinic acids useful in the practice of the invention may include mono and diphosphinic acids having the general formula $R'R_xH_{(1-x)}POOH$, where R and R' are the same or different 3–18 carbon (but preferably 6–10 carbon) organic groups such as alkyl or aryl groups, and x is 0–1. The most significant resonance forms for the mono phosphinic acid are shown as follows:

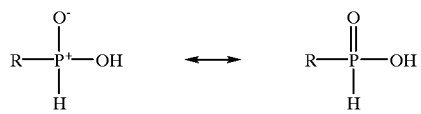

The most significant resonance forms for the diphosphinic acid are shown as follows:

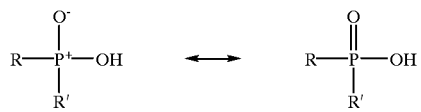

Typically, the second organic surfactant will comprise a 6–10 carbon alkyl phosphonic acid, e.g., hexyl phosphonic acid. To avoid introducing uncontrollable impurities into the reaction which could have an effect on control of the growth of the semiconductor nanocrystals, the purity of the second organic surfactant in the binary mixture should be at least 95 wt. % e. Concentration of Respective Surfactants in Binary Mixture

While we do not wish to be bound by any particular theories as to how the surfactants operate in the reaction to control both the size and shape of the semiconductor nanocrystals, it is believed that one or both of the surfactants in the binary mixture of surfactants binds or associates with the metal precursor, i.e., the Group II metal, to slow the initial growth of the semiconductor crystal, thus resulting in the formation or growth of the desired nanocrystals, rather than macro crystals. It is also believed that the second surfactant in the binary mixture further preferably binds to certain faces of the growing crystallites, depending upon the concentration of the second surfactant in the binary mixture, to control the shape of the growing crystallite as well, i.e., to control whether or not spheres or rods of semiconductor nanocrystals will form.

With the above in mind, it has been found the presence of less than a certain weight percentage of the second surfactant in the binary mixture will result in the formation and growth of generally spherical nanocrystals. Thus, for example, when tri-octyl phosphine oxide (TOPO) was used as the surfactant in the binary mixture as the first surfactant to promote the formation of spherical semiconductor nanocrystals and hexyl phosphonic acid was used as the second surfactant in the binary mixture, concentrations of 1.5 wt. % (3.42 molar %) and 3 wt. % (6.71 molar %) hexyl phosphonic acid in the binary mixture (i.e., less than about 5 weight % (10.91 molar %), with the balance TOPO, results in formation of generally spherical nanocrystals, while respective concentrations of 5 wt. % (10.91 molar %), 10 wt. % (20.54 molar %), and 20 wt. % (37 molar %) hexyl phosphinic acid in the binary mixture, with the balance comprising TOPO, reproducibly produce rod-like shaped semiconductor nanocrystals.

Thus, to grow nanocrystals having two axes of very small length, with an enlarged third diameter, i.e., a rod of very small cross sectional area, larger concentrations of the second surfactant must be used in the binary mixture of surfactants. Exact concentrations of a particular second surfactant necessary to achieve a rod-like semiconductor nanocrystal rather than a spherical nanocrystal will depend upon the particular first and second surfactants used and the particular Group II and Group VI precursors, and may be empirically determined for each binary mixture of surfactants and particular precursors.

f. Temperatures of Binary Mixture of Surfactants Before and After Introduction of Precursor Solution During the initial introduction of the dissolved Group II and Group VI precursors, the solution of precursors is injected into the high boiling binary mixture of surfactants comprising the reaction media while the binary mixture is maintained at a first temperature which results in instantaneous nucleation of seed crystals. This temperature, for example, when cadmium selenide (CdSe) nanocrystals are being formed in a binary mixture of TOPO and hexyl phosphonic acid, may be about 360° C. While initiation of the crystal growth at this higher first temperature is important to the preferential growth of nanocrystals of the precursors rather than macro crystals, it is equally important that the continued nucleation of such seed crystals be arrested in favor of growth of the already formed seed crystals. If the continued nucleation is not stopped, the processes of nucleation and growth will coexist for a certain amount of time, resulting in a final large distribution of both aspect ratios and sizes for the nanocrystals.

Therefore, the solution of precursors is injected, preferably as a cold solution, e.g., at room temperature, so that immediately after the injection the temperature of the high boiling binary mixture of surfactants drops to a second temperature of lower value which is kept constant during the nanocrystal growth. This temperature, for example, when cadmium selenide (CdSe) semiconductor nanocrystals are formed in a binary solution of TOPO and hexyl phosphonic acid, may range from about 250° C. to about 300° C. if the initial temperature ranges from 280° C. to 360° C.

Subsequent nanocrystal growth is then stopped by a further reduction of the temperature to below the temperature at which nanocrystal growth occurs. Since this temperature may vary from precursor to precursor, and precise control of the time period for crystal growth is desirable, cessation of the crystal growth may be conveniently accomplished by rapidly reducing the temperature to ambient temperature or even lower, e.g., down to about 25° C. or lower, e.g., by removing the heating mantle, and can be more rapid if the walls of the reactor are cooled with a stream of air.

g. Concentration of Precursors in Solvent

The particular Group II and Group VI precursors may be dissolved in any organic liquid compatible with the binary mixture of surfactants, such as any polar organic solvent such as a trialkyl phosphine, e.g., tributyl phosphine. The precursors may be dissolved in the same solvent or may be dissolved separately to form two solutions. Advantageously, for purposes of subsequently injecting the dissolved precursors into the heated binary mixture of surfactants, it is preferred to form a single solution containing all the dissolved precursors therein.

The solution or solutions containing the dissolved precursors are maintained at a temperature below crystal growth temperature (conveniently at ambient temperature or lower), while the binary mixture of surfactants is heated to the first (nucleation) temperature. The solution (or solutions) containing the precursors is then injected into the binary mixture liquid media at a high rate of speed, for example through a needle or a pressurized nozzle, to thereby rapidly heat the precursors up to the first nucleation temperature. The concentration of the precursors in the high boiling binary mixture liquid media should initially be about 0.18 M at the time of initial injection of the precursor solution into the high boiling binary mixture liquid media.

h. Time of Reaction to Grow Semiconductor Nanocrystal Rods

The time of the reaction to grow the Group II-VI semiconductor nanocrystal rods will vary with the type of semiconductor precursors, the composition and temperature of the binary mixture of surfactants constituting the liquid media in which the crystals are growing, and the concentration of the precursors in the binary mixture of surfactants, as well as the desired length and aspect ratio of the semiconductor nanocrystal rods. For example, for the growth of CdSe semiconductor rods having an average length of 150 nm, and an aspect ratio of 5, in a binary mixture liquid media maintained at a temperature of about 300° C., and at a precursor concentration of 0.18 M, the desired semiconductor nanocrystals may be grown in a period of from about 300 seconds to about 600 seconds. If spherical semiconductor nanocrystal growth is desired, the time periods may be extended to as long as several hours.

The following will serve to further illustrate the practice of the invention.

To form CdSe semiconductor nanocrystals, a solution of Cd and Se precursors is prepared by dissolving 0.82 grams of $Cd(CH_3)_2$ and 0.4 grams of Se powder into 15.3 grams of tributyl phosphine. 2 ml. of this solution (kept at −10° C.) was then quickly injected into 4 grams of a heated bath comprising a binary mixture of (99% pure) tri-octyl phosphine oxide (TOPO) and 17 molar % hexyl phosphonic acid (HPA) which had been preheated to a temperature of about 360° C. After the injection, the temperature of the binary mixture bath drops to approximately 300° C. and is kept at this temperature for about 5–10 minutes for the fast growth of rod-like semiconductor nanocrystals. After this time period, the binary mixture bath is rapidly cooled. The same procedure may be used to form spherical semiconductor nanocrystals by reducing the concentration of the HPA down to, for example, about 4 molar % and increasing the reaction time at 300° C. up to several hours.

The reaction was repeated several times with the concentration of the HPA surfactant in the binary mixture bath respectively at 1.5 weight % (3.42 molar %), 3.0 weight % (6.61 molar %), 5.0 weight % (10.91 molar %), 8.0 weight % (16.83 molar %), 10.0 weight % (20.54 molar %), and 20.0 weight % (36.78 molar %), with the reaction time extended to several hours for the reactions using 1.5 and 3.0 weight % HPA. The semiconductor nanocrystals recovered from each batch were examined under transmission electron microscopy (TEM) and powder x-ray diffraction (XRD). The semiconductor nanocrystals grown in the baths respectively containing 1.5 and 3.0 weight % of the HPA growth control agent were generally spherical in shape, while the semiconductor nanocrystals grown in the baths containing 5.0, 8.0. 10.0, and 20.0 weight % HPA had rod-shaped morphologies. Both measurements showed that the long axis of the rods along the c-axis was consistent with a wurtzite structure. Perpendicular to the c-axis, the semiconductor nanocrystal rods appear as faceted hexagons. Similar results may be obtained substituting other particular Group II metals (Zn or Hg) for Cd and/or substituting other particular Group VI precursors (S or Te) for Se.

Having thus described the invention what is claimed is:

1. A process for the formation of Group II-VI semiconductor nanocrystals comprises introducing the precursors into a heated binary mixture of first and second different surfactants capable of promoting the growth of either spherical semiconductor nanocrystals or rod-like semiconductor nanocrystals, whereby the shape of said semiconductor nanocrystals formed in said binary mixture of surfactants is capable of being controlled by adjusting the ratio of said first and second surfactants in said binary mixture.

2. The process of claim 1 wherein said heated binary mixture of surfactants comprises two different phosphorus-containing surfactants.

3. The process of claim 2 wherein said binary mixture of phosphorus-containing surfactants is maintained at a temperature sufficiently high to promote said growth of said semiconductor nanocrystals.

4. The process of claim 2 wherein said ratio of said first and said second phosphorus-containing surfactants in said heated binary mixture of surfactants permits growth of substantially spherical semiconductor nanocrystals in said binary mixture.

5. The process of claim 2 wherein said ratio of said first and said second phosphorus-containing surfactants in said heated binary mixture of surfactants permits growth of rod-like semiconductor nanocrystals in said binary mixture.

6. The process of claim 5 wherein said second phosphorus-containing surfactant in said binary mixture of surfactants comprises a phosphorus-containing organic acid.

7. The process of claim 6 wherein said phosphorus-containing organic acid surfactant comprises a phosphonic acid surfactant having the formula ROP(OH)$_2$, where R is a 3–18 carbon organic group.

8. The process of claim 6 wherein said phosphorus-containing organic acid surfactant is a phosphinic acid having the formula R'R$_x$H$_{(1-x)}$POOH, where R and R' are the same or different 3–18 carbon organic groups and x is 0–1.

9. A process for forming shaped Group II-VI semiconductor nanocrystals in a heated binary mixture of surfactants which comprises:

a) forming one or more solutions, each comprising one or more Group II and/or Group VI semiconductor nanocrystal precursors dissolved in a liquid which is a solvent for said one or more semiconductor precursors;

b) forming a binary mixture of high boiling organic surfactants comprising:
   i) a first surfactant; and
   ii) a second surfactant;

c) adjusting the ratio of said first and second surfactants in said binary mixture to control the shape of said semiconductor nanocrystals to be formed therein;

d) heating said binary mixture of surfactants to a temperature at which said Group II and Group VI precursors will react in said heated binary mixture of surfactants to form said Group II-VI semiconductor nanocrystals;

e) adding said one or more solutions of Group II and Group VI semiconductor nanocrystal precursors to said heated binary mixture of surfactants to form said semiconductor nanocrystals; and f) subsequently reducing the temperature of said heated binary mixture of surfactants containing said semiconductor nanocrystals to stop said growth of said semiconductor nanocrystals.

10. The process of claim 9 wherein said step of forming said one or more solutions, each comprising one or more Group II and Group VI semiconductor nanocrystal precursors dissolved in a liquid which is a solvent for said one or more semiconductor precursors further comprises:

(a) forming a first solution containing at least one Group II metal selected from the group consisting of Zn, Cd, and Hg; and (b) forming a second solution containing at least one Group VI element selected from the group consisting of S, Se, and Te.

11. The process of claim 9 wherein said step of forming said one or more solutions, each comprising one or more Group II and Group VI semiconductor nanocrystal precursors dissolved in a liquid which is a solvent for said one or more semiconductor precursors further comprises forming a single solution containing a) at least one or more Group II metals, or compounds containing Group II metals, selected from the group consisting of Zn, Cd, and Hg; and (b) at least one or more Group VI elements, or compounds containing Group VI elements, selected from the group consisting of S, Se, and Te.

12. The process of claim 9 wherein at least one of said one or more solutions comprises a) a particular Group II metal; and b) a particular Group VI element.

13. The process of claim 9 wherein:

a) said heating step is carried out until said binary mixture of surfactants reaches a temperature at which said semiconductor nanocrystals will nucleate when said one or more solutions are added to said binary mixture;

b) said nucleation temperature is lowered to a crystal growth temperature after said step of adding said solution to said heated binary mixture of surfactants; and c) said heated binary mixture of surfactants containing said one or more solutions is maintained at said crystal growth temperature until said step of reducing the temperature of said mixture containing said solution sufficiently to stop formation of said semiconductor nanocrystals.

14. The process of claim 9 wherein said concentration of said first surfactant in said binary mixture of surfactants is increased sufficiently to permit growth of substantially spherical semiconductor nanocrystals in said binary mixture of surfactants.

15. The process of claim 9 wherein said concentration of said second surfactant in said binary mixture of surfactants is increased sufficiently to permit growth of rod-like semiconductor nanocrystals in said binary mixture of surfactants.

16. The process of claim 9 wherein said heated binary mixture of surfactants comprises two different phosphorus-containing surfactants.

17. The process of claim 16 wherein said second phosphorus-containing surfactant in said binary mixture of surfactants comprises a phosphorus-containing organic acid.

18. The process of claim 17 wherein said phosphorus-containing organic acid second surfactant comprises a phosphonic acid surfactant having the formula $ROP(OH)_2$, where R is a 3–18 carbon organic group.

19. The process of claim 17 wherein said phosphorus-containing organic acid second surfactant is a phosphinic acid having the formula $R'R_xH_{(1-x)}POOH$, where R and R' are the same or different 3–18 carbon organic groups and x is 0–1.

20. A process for forming shaped Group II-VI semiconductor nanocrystals in a heated binary mixture of surfactants which comprises:
    a) forming a solution comprising:
        i) a first semiconductor precursor comprising one or more particular Group II metals, or compounds containing one or more particular Group II metals;
        ii) a second semiconductor precursor comprising one or more particular Group VI elements, or compounds containing one or more particular Group VI elements; and
        iii) a liquid which is a solvent for said first and second precursors;
    b) forming a binary mixture of high boiling phosphorus-containing organic surfactants comprising:
        i) a first surfactant capable of promoting growth of spherical semiconductor nanocrystals when a sufficient amount of said surfactant is present in said binary mixture of surfactants; and
        ii) a second surfactant capable of promoting growth of rod-like shaped semiconductor nanocrystals when a sufficient amount of said surfactant is present in said binary mixture of surfactants;
    c) adjusting the ratio of said first and second surfactants in said binary mixture to control the shape of said semiconductor nanocrystals to be formed therein;
    d) heating said binary mixture of phosphorus-containing organic surfactants to a temperature sufficient to permit formation of Group II-VI semiconductor nanocrystals therein;
    e) adding said solution of Group II and Group VI semiconductor nanocrystal precursors to said heated binary mixture of surfactants to form said semiconductor nanocrystals; and
    f) subsequently reducing the temperature of said heated binary mixture of surfactants containing said semiconductor nanocrystals to stop said growth of said semiconductor nanocrystals.

21. The process of claim 20 wherein:
    a) said heating step is carried out until said binary mixture of surfactants reaches a temperature at which said semiconductor nanocrystals will nucleate when said one or more solutions are added to said binary mixture;
    b) said nucleation temperature is lowered to a crystal growth temperature during or after said step of adding said solution to said heated binary mixture of surfactants; and
    c) said heated binary mixture of surfactants containing said one or more solutions is maintained at said crystal growth temperature until said step of reducing the temperature of said mixture containing said solution sufficiently to stop formation of said semiconductor nanocrystals.

22. The process of claim 21 wherein said nucleation temperature is lowered to a crystal growth temperature during said step of adding said solution of Group II and Group VI semiconductor nanocrystal precursors to said heated binary mixture of surfactants by adding to said binary mixture of surfactants said solution of Group II and Group VI semiconductor nanocrystal precursors at a temperature sufficiently lower than the temperature of said binary surfactant mixture to thereby cool said binary mixture of surfactants down to said crystal growth temperature as said solution of Group II and Group VI semiconductor nanocrystal precursors is added to said heated binary mixture.

23. The process of claim 20 wherein said Group II metal is selected from the group consisting of Zn, Cd, and Hg; and said Group VI element is selected from the group consisting of S, Se, and Te.

24. The process of claim 20 wherein said liquid which is a solvent for said first and second precursors comprises a polar organic solvent.

25. The process of claim 23 wherein said solvent comprises a trialkyl phosphine.

26. The process of claim 20 wherein said first surfactant in said binary mixture of surfactants is selected from the group consisting of a 3–18 carbon tri-alkyl phosphine and a 3–18 carbon tri-alkyl phosphine oxide.

27. The process of claim 20 wherein said second surfactant in said binary mixture of surfactants comprises a phosphorus-containing organic acid.

28. The process of claim 27 wherein said phosphorus-containing organic acid second surfactant in said binary mixture comprises phosphonic acid having the formula $ROP(OH)_2$, where R is a 3–18 carbon organic group.

29. The process of claim 28 wherein said phosphonic acid second surfactant comprises hexyl-phosphonic acid.

30. The process of claim 27 wherein said phosphorus-containing organic acid second surfactant is a phosphinic acid having the formula $R'R_xH_{(1-x)}POOH$, where R and R' are the same or different 3–18 carbon organic groups and x is 0–1.

31. A process for forming shaped CdSe semiconductor nanocrystals in a heated binary mixture of surfactants which comprises:
    a) forming a solution comprising:
        i) a first semiconductor precursor comprising Cd metal, and/or one or more compounds containing Cd metal;
        ii) a second semiconductor precursor comprising Se, and/or one or more compounds containing Se; and
        iii) a liquid which is a solvent for said first and second precursors;
    b) forming a binary mixture of high boiling phosphorus-containing organic surfactants comprising:
        i) a first phosphorus-containing surfactant capable of promoting growth of spherical semiconductor nanocrystals with increased percentage of said first surfactant in the ratio of said surfactants in said binary mixture of surfactants; and
        ii) a second surfactant capable of promoting growth of rod-like shaped semiconductor nanocrystals with increased percentage of said second surfactant in the ratio of said surfactants in said binary mixture of surfactants;

c) adjusting the ratio of said first and second surfactants in said binary mixture to control the shape of said CdSe semiconductor nanocrystals to be formed therein;

d) heating said binary mixture of phosphorus-containing organic surfactants to a temperature sufficient to permit formation of Group II-VI semiconductor nanocrystals therein;

e) adding said solution of Cd and Se semiconductor nanocrystal precursors to said heated binary mixture of surfactants to form said CdSe semiconductor nanocrystals; and f) subsequently reducing the temperature of said heated binary mixture of surfactants containing said semiconductor nanocrystals to stop said growth of said semiconductor nanocrystals.

32. A rod-like Group II-VI semiconductor nanocrystal formed by reacting together a precursor containing one or more Group II metals selected from the group consisting of Zn, Cd, and Hg with a precursor containing one or more Group VI elements selected from the group consisting of S, Se, and Te in a binary mixture of surfactants which includes an organo phosphorus-containing surfactant capable of promoting growth of rod-like semiconductor nanocrystals when a sufficient amount of said surfactant is present in said binary mixture of surfactants.

33. The rod-like Group II-VI semiconductor nanocrystal of claim 32 wherein said organo phosphorus-containing surfactant comprises an organo phosphorus-containing acid surfactant.

34. The rod-like Group II-VI semiconductor nanocrystal of claim 32 wherein the particular Group II metal is cadmium (Cd) and the particular Group VI element is selenium (Se).

35. The rod-like CdSe semiconductor nanocrystal of claim 34 wherein said rod-like CdSe semiconductor nanocrystal is hexagonal in cross-section.

36. A rod shaped CdSe semiconductor nanocrystal formed by reacting together a Cd precursor with a Se precursor in a binary mixture of phosphorus-containing organic surfactants containing at least 5 wt. % of an organo phosphorus-containing acid surfactant.

* * * * *